(12) United States Patent
Sz

(10) Patent No.: US 7,534,156 B2
(45) Date of Patent: May 19, 2009

(54) ORGANIC LIGHT-EMITTING DIODE AND METHOD OF FABRICATION THE SAME

(75) Inventor: Guo-Huei Sz, Hukou Township, Hsinchu County (TW)

(73) Assignee: Au Optronics Corp., Hsinchu (TW)

( * ) Notice: Subject to any disclaimer, the term of this patent is extended or adjusted under 35 U.S.C. 154(b) by 124 days.

(21) Appl. No.: 10/899,413

(22) Filed: Jul. 26, 2004

(65) Prior Publication Data

US 2005/0218802 A1 Oct. 6, 2005

(30) Foreign Application Priority Data

Apr. 1, 2004 (TW) .............................. 93109036 A

(51) Int. Cl.
*H01J 1/62* (2006.01)
*H01J 63/04* (2006.01)
*H01J 9/00* (2006.01)

(52) U.S. Cl. .......................... 445/24; 445/25; 313/506; 313/512; 313/504

(58) Field of Classification Search ................. 313/512; 445/25

See application file for complete search history.

(56) References Cited

U.S. PATENT DOCUMENTS

| 4,640,583 | A | * | 2/1987 | Hoshikawa et al. | .......... 349/153 |
| 5,037,185 | A | * | 8/1991 | Grupp | ......................... 349/195 |
| 5,882,761 | A | * | 3/1999 | Kawami et al. | ............. 313/512 |
| 5,949,087 | A | | 9/1999 | Cooper | |
| 6,819,391 | B2 | * | 11/2004 | Kim et al. | .................... 349/157 |
| 7,038,376 | B2 | * | 5/2006 | Liedenbaum | ............... 313/512 |
| 2004/0250015 | A1 | | 12/2004 | Ando | |

FOREIGN PATENT DOCUMENTS

| JP | 2002025764 | 1/2002 |
| JP | 2005025764 | 1/2002 |
| TW | 560018 | 11/2003 |
| TW | 576126 | 2/2004 |

OTHER PUBLICATIONS

CN Office Action mailed Apr. 6, 2007.

* cited by examiner

*Primary Examiner*—Nimeshkumar D. Patel
*Assistant Examiner*—Natalie K Walford
(74) *Attorney, Agent, or Firm*—Thomas, Kayden, Horstemeyer & Risley

(57) ABSTRACT

An organic light-emitting diode. The diode structure includes a substrate having edges, and a sealing layer formed on the edges thereof, wherein at least a breach is formed at a corner of the sealing layer. A method of fabricating the OLED is also disclosed.

8 Claims, 6 Drawing Sheets

ORGANIC LIGHT-EMITTING DIODE AND METHOD OF FABRICATION THE SAME

BACKGROUND OF THE INVENTION

1. Field of the Invention

The present invention relates to an optoelectrical element, and more specifically to an organic light-emitting diode and method of fabrication the same.

2. Description of the Related Art

Moisture may permeate an OLED device after extended use, due to the deterioration of seal performance, with moisture reacting with highly activated metal electrodes inside the OLED, finally resulting in cleavage of materials or dark spots, reducing the active lifetime of the device.

A related OLED device is disclosed in U.S. Pat. No. 5,882,761, and illustrated in FIG. 1a. The OLED device comprises a glass substrate 2, a lamination body 6 comprising an ITO electrode (i.e. $In_2O_3$ :Sn film electrode) 3, an organic luminescent material layer 4 and a cathode 5, a glass sealing case 7, a drying substance 8, a sealing agent 9, and a glass substrate 10 The sealing agent 9 comprises a UV-cured resin applied to the edges thereof to bind a sealing case 7, forming an airtight space 11 therebetween.

In the process, a breach 12 is formed at a midway position of coating route 13, and its two end points 12a and 12b extend toward the exterior, as shown in FIG. 1b. Thus, after pressing, as shown in FIG. 1c, the connection point 14 of the coating route 13 may thicken due to original sealing agent conformation and interior gas pressure, possibly resulting in sealing agent outflow.

Additionally, breach size is difficult to control, because the diffusion rate of the sealing agent in the midway position may be influenced by gas pressure, during pressing. If the breach is too wide, the subsequently formed connection point may thin, and if too narrow, the sealing layer may be penetrated, due to the increase in interior pressure. Both conditions threaten OLED seal performance.

SUMMARY OF THE INVENTION

In order to solve the conventional problems, an object of the invention is to provide a conformation in which a breach is formed at a corner position of a coating route, to improve the seal performance and protect interior elements from moisture.

The OLED structure provided in the invention includes a substrate having edges and a sealing layer formed on the edges thereof, wherein at least a breach is formed at a corner of the sealing layer.

Proper breach size is provided in the present invention, because effects of interior gas pressure are reduced in the corner position. Additionally, the present method provides a larger breach size than the related art to release interior gas pressure more rapidly.

Another object of the invention is to provide a method of fabricating an OLED, including the following steps. A first substrate having edges is provided, and an illuminative element is installed on the inner surface thereof. Subsequently, a sealing layer is formed along the edges of the first substrate, with at least a breach formed at a corner thereof. Finally, a second substrate is provided, bound to the first substrate by the sealing layer to form an airtight space containing the illuminative element.

Compared to the related art's control of numerous starting points and terminal points of various breaches, the present invention merely notes the terminal point of the coating route, because the breach is situated at the corner position, whereby the invention provides a convenient and rapid method for applying the sealing layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
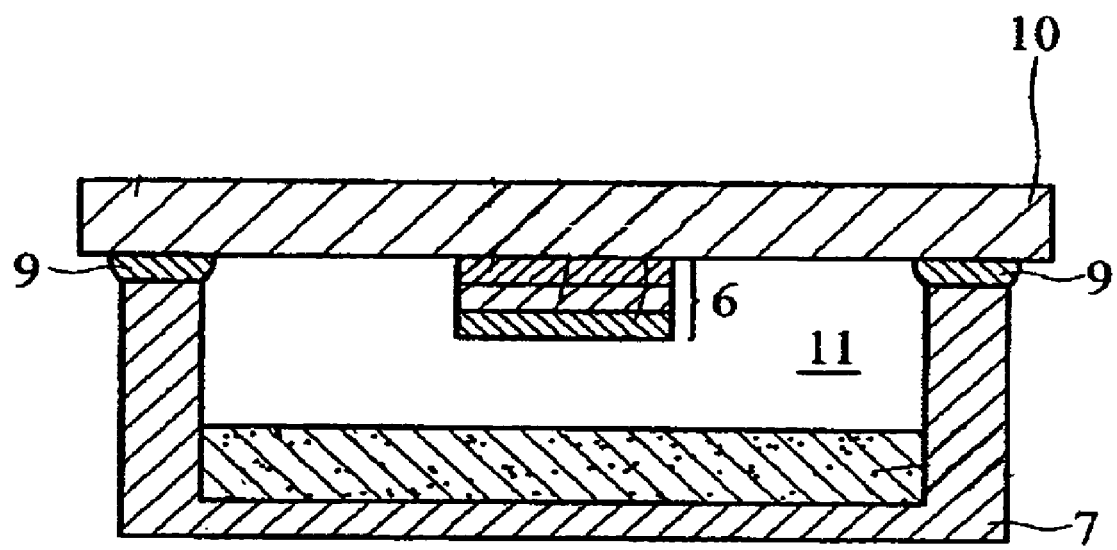
FIG. 1a is a cross section of an OLED in U.S. Pat. No. 5,882,761.
Figure 1B:
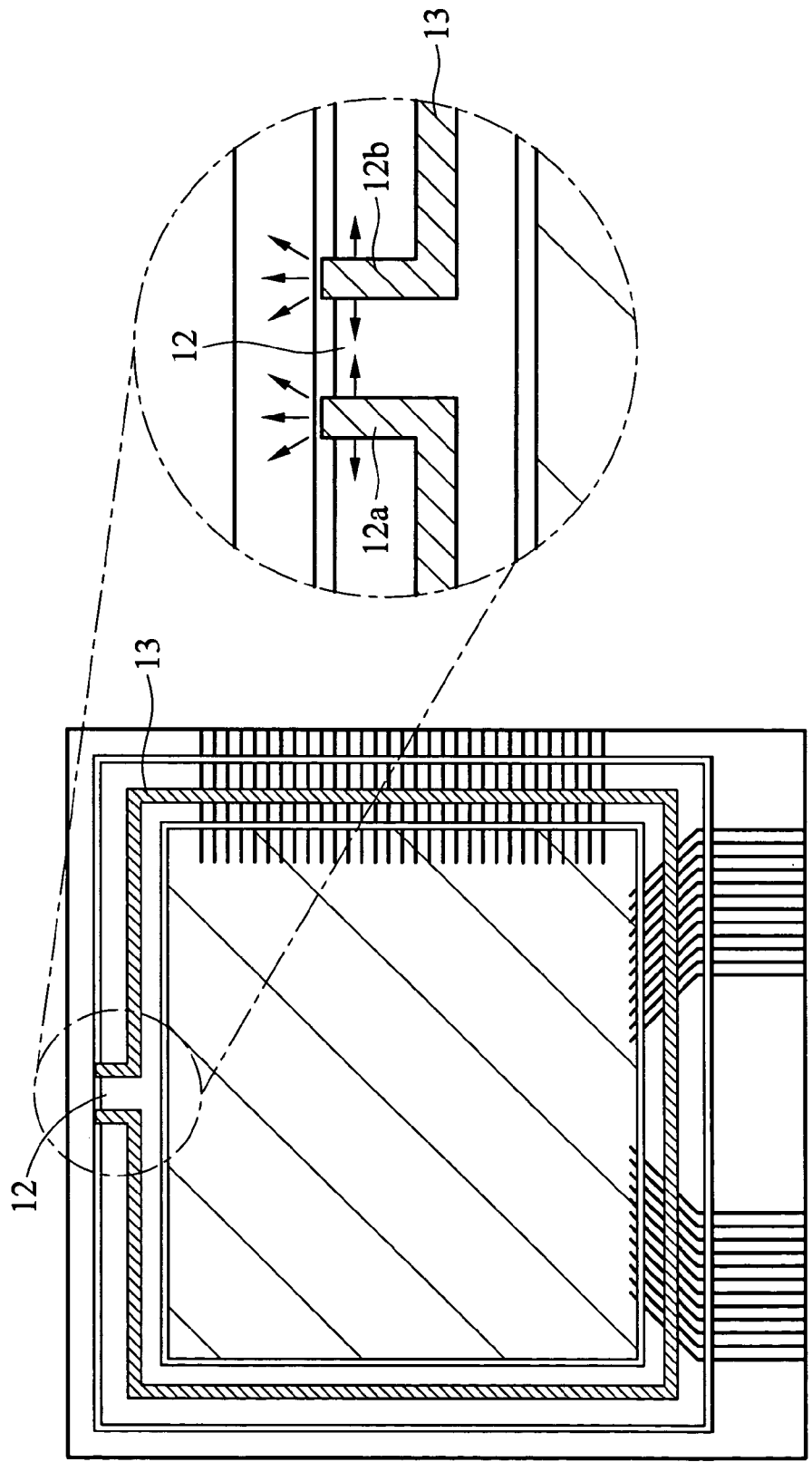
FIG. 1b is a top view of a related coating, route.
Figure 1C:
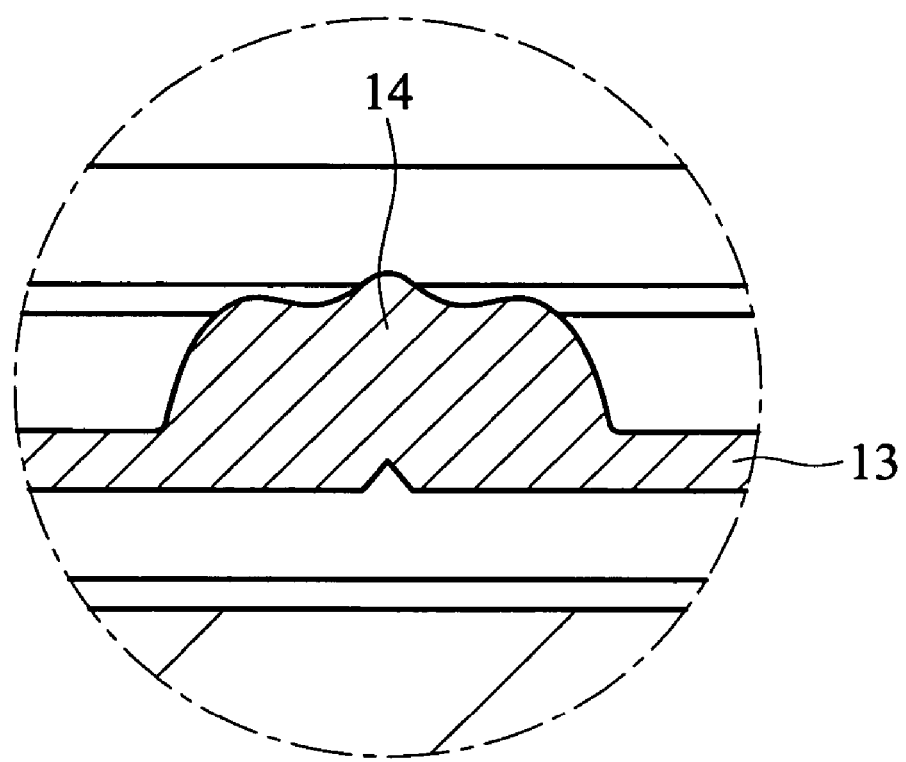
FIG. 1c is an enlarged view of the part of the related seal behavior.
Figure 2:
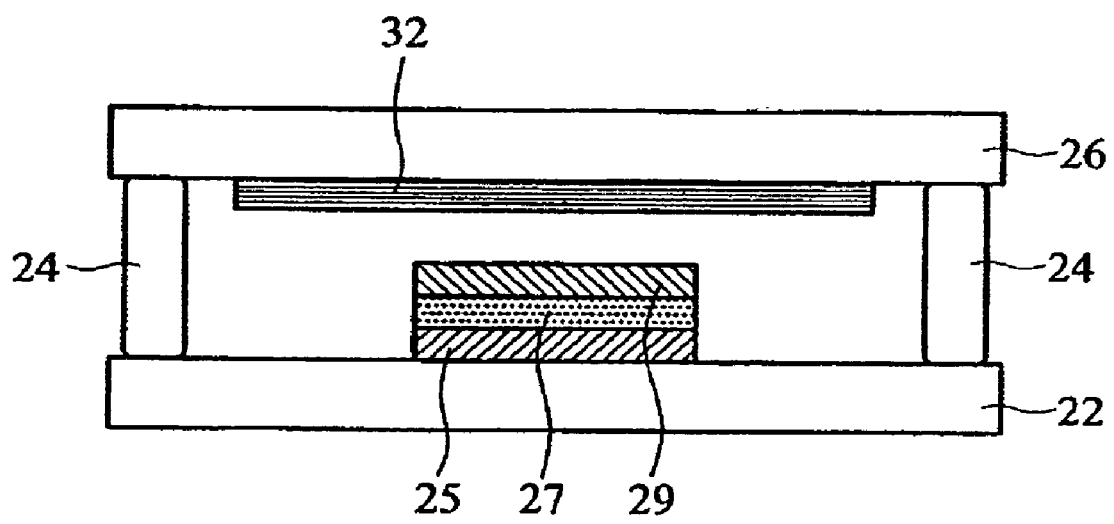
FIG. 2 is a cross section of the method of fabricating an OLED in the embodiment of the invention.

FIG. 2 is a cross section of the method of fabricating the OLED according to the embodiment of the invention. First, referring to FIG. 2, a substrate 22 having edges is provided. The substrate 22 comprises glass, polymer, ceramic, or plastic, wherein the plastic substrate comprises polyethyleneterephthalate, polyester, polycarbonates, polyimide, arton, polyacrylates, or polystyrene.

Next, a first electrode 25 is formed on the substrate 22. The first electrode 25 is a transparent electrode, and may comprise indium tin oxide (ITO), indium zinc oxide (IZO), aluminum zinc oxide (AZO), or zinc oxide (ZnO).

Subsequently, an organic light-emitting structural layer is formed on the first electrode 25, comprising an electron-transport layer (not shown), an organic light-emitting layer 27, and a hole-transport layer (not shown) in order. The organic light-emitting layer 27 comprises a single or multiple organic illuminative layers. The organic illuminative materials comprise micromolecules or macromolecules of fluorescent or phosphorescent materials, wherein the micromolecule organic illuminative materials covering the first electrode 25 are formed by vacuum evaporation, and the macromolecule organic illuminative materials are formed by spin-on coating, injection, or screen printing.

Next, a second electrode 29 is formed on the organic light-emitting layer 27. The second electrode 29 may be a single or multiple metal electrode layers, and may comprise Li, Mg, Ca, Al, Ag, In, Au, Ni, Pt, or combinations thereof.

Figure 3:
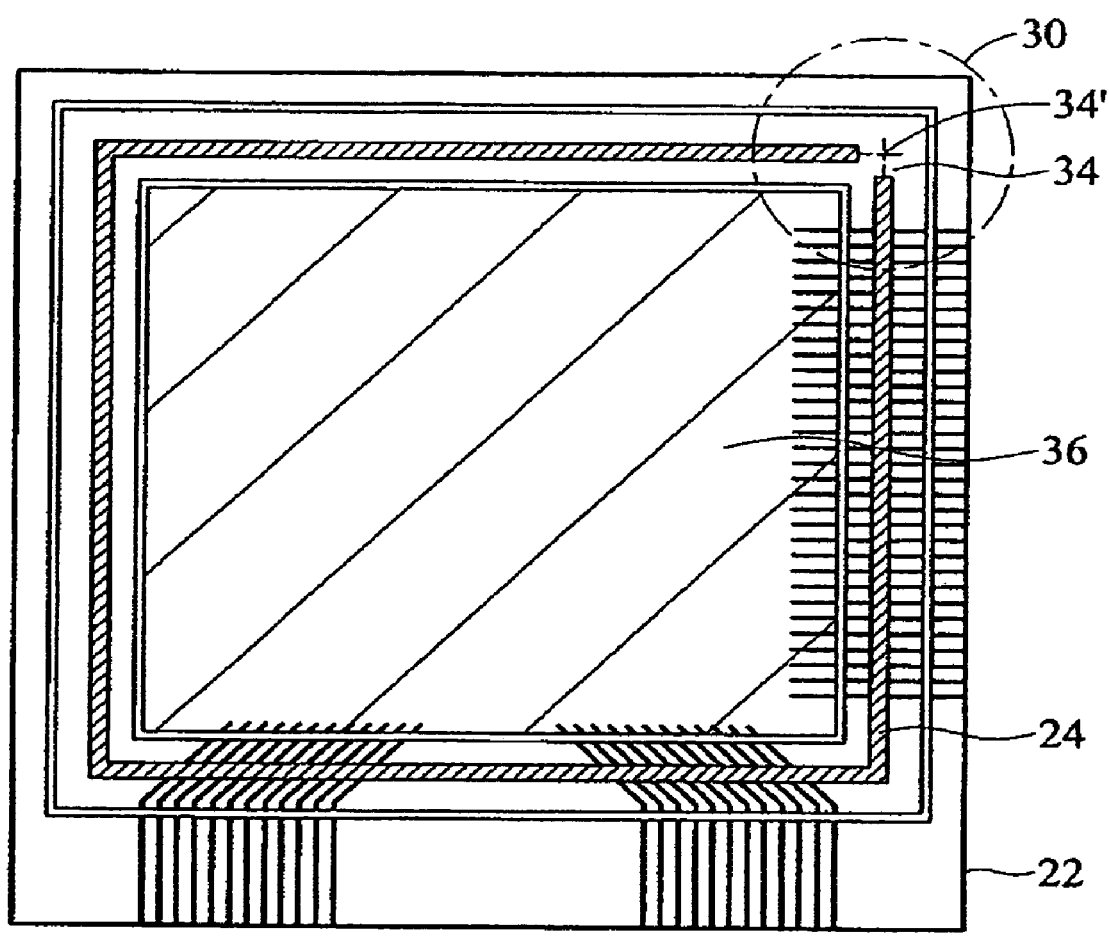
FIG. 3 is a top view of a coating route in the embodiment of the invention.

Subsequently, a coating route 24 is formed by screen printing or optical coating method along the edges of the substrate 22, as shown in FIG. 3. The sealing agent may comprise a UV-cured resin, and the width of the coating route 24 is about 5~10 mm, preferably 8 mm. Additionally, the coating route 24 is square, rectangular, or polygonal, varying with display region shape 36.

Referring to FIG. 3, during coating of the sealing layer, a breach 34 serving as a pressure release point is formed at a corner position 30. The number of breaches 34 is altered with display region size 36. If the display region size is larger, more breaches 34 are required, and if smaller, fewer. Additionally, as the breach count increases, individual sizes decreases, or the inverse, wherein the distance from the breach center 34' to the coating route 24 is about 3~7 mm, preferably 5 mm.

The diffusion paths and rates of the sealing agent at the corner position 30 can be precisely estimated due to immunity to interior gas pressure, thus a proper breach size can be formed.

Additionally, a larger breach size is formed in the present invention, because the diffusion rate of the sealing agent at the corner position 30 is faster than other positions. As it releases interior pressure more rapidly to protect the sealing layer from cracks, the gas outflow efficiency exceeds 50%.

Compared to the related art's control of numerous starting points and terminal points of various breaches, the present invention merely notes the terminal point of the coating route 24, because the breach 34 is situated at the corner position 30, whereby the invention provides a convenient and rapid method for applying the sealing layer.

Finally, Referring to FIG. 2, a sealing case 26 is provided, bound to the edges of the substrate 22 by the sealing agent 24, and an airtight space containing the first electrode 25, an organic light-emitting layer 27, and the second electrode 29 is formed therebetween. The sealing case 26 may have a plane or concave substrate, and comprise glass, polymer, ceramic, or metal.

Figure 4:
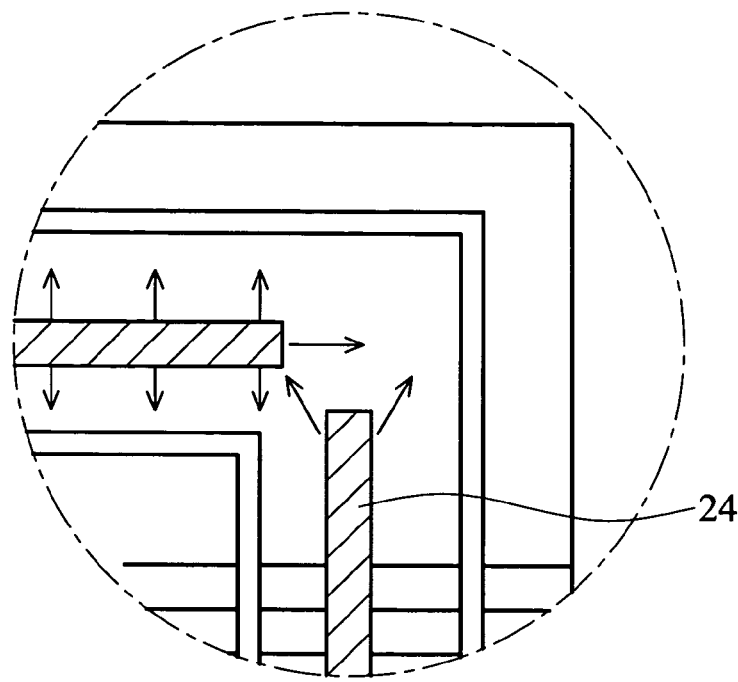
FIGS. 4~5 are enlarged views of the part of the corner position shown in FIG. 3 in the embodiment of the invention.
Figure 5:
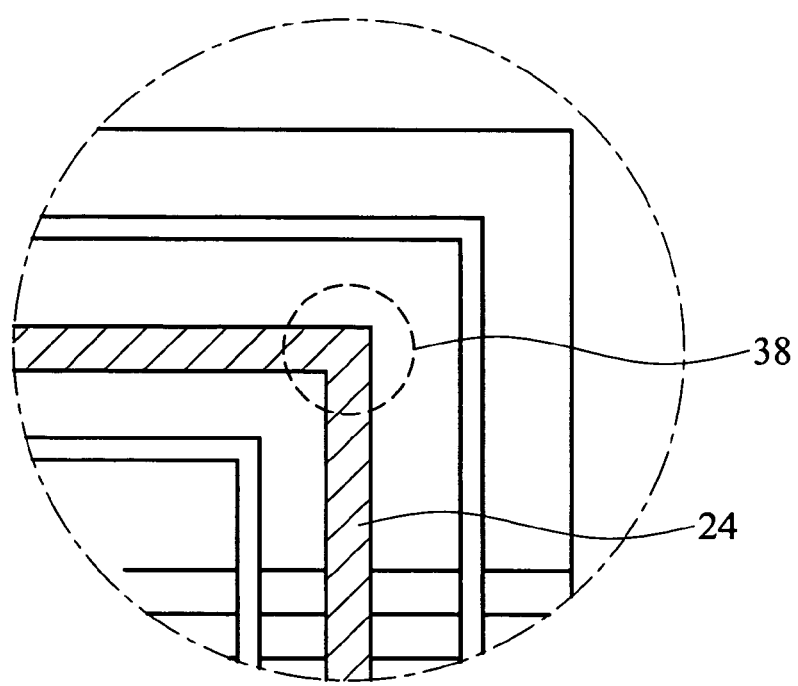

Referring to FIGS. 4 and 5, when pressing is performed, the sealing agent proceeds in various directions, as shown in FIG. 4, whereby improved pressing performance is generated, for example, where uniform width of the coating route 24, especially at the connection point 38, as shown in FIG. 5.

Additionally, a drying layer 32 may be installed on the inner surface of the sealing case 26. The drying layer 32 may comprise metal oxide (e.g. alkaline metal oxide or alkaline-earth metal oxide), metal sulfide, metal halide, metal perchlorate, or highly active metal (e.g. alkaline metal or alkaline-earth metal), at a thickness of less than 10 μm.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating an organic light-emitting diode (OLED) device, comprising:
    providing a first substrate having edges;
    installing an illuminative element on the first substrate;
    forming a sealing layer along the edges of the first substrate, wherein at least a breach is formed at a corner of the sealing layer, and a breach's center and adjacent parts of the sealing layer have a distance of about 3~7 mm; and
    binding a second substrate to the edges of the first substrate by the sealing layer to press on the sealing layer so that an interior pressure being released and the breach being closed by the adjacent parts of the sealing layer after binding to form an airtight space containing the illuminative element.

2. The method as claimed in claim 1, wherein the first substrate comprises glass, polymer, or ceramic.

3. The method as claimed in claim 1, wherein the illuminative element comprises at least an anode layer, an organic illuminative layer, and a cathode layer.

4. The method as claimed in claim 1, wherein the sealing layer comprises UV-cured resin.

5. The method as claimed in claim 1, wherein the sealing layer has a width of about 5~20 mm.

6. The method as claimed in claim 1, wherein the sealing layer is substantially square, rectangular, or polygonal.

7. The method as claimed in claim 1, wherein the second substrate comprises glass, polymer, ceramic, or metal.

8. A method of fabricating an organic light-emitting diode (OLED) device, comprising:
    providing a first substrate having edges;
    installing an illuminative element installed on the first substrate;
    forming a sealing layer along the edges of the first substrate, wherein at least a breach is formed at a corner of the sealing layer, and a center point of the breach and adjacent parts of the sealing layer define a distance; and
    binding a second substrate to the edges of the first substrate by the sealing layer to press on the sealing layer so that an interior pressure being released and the breach being closed by the adjacent parts of the sealing layer after binding to form an airtight space containing the illuminative element.

\* \* \* \* \*